(12) United States Patent
Casasanta et al.

(10) Patent No.: US 7,723,913 B2
(45) Date of Patent: May 25, 2010

(54) GRADED JUNCTION SILICON NANOCRYSTAL EMBEDDED SILICON OXIDE ELECTROLUMINESCENCE DEVICE

(75) Inventors: Vincenzo Casasanta, Woodinville, WA (US); Apostolos T. Voutsas, Portland, OR (US); Pooran Chandra Joshi, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 135 days.

(21) Appl. No.: 12/168,771

(22) Filed: Jul. 7, 2008

(65) Prior Publication Data

US 2009/0033206 A1 Feb. 5, 2009

Related U.S. Application Data

(63) Continuation-in-part of application No. 12/126,430, filed on May 23, 2008, which is a continuation-in-part of application No. 11/418,273, filed on May 4, 2006, now Pat. No. 7,544,625, which is a continuation-in-part of application No. 11/327,612, filed on Jan. 6, 2006, and a continuation-in-part of application No. 11/013,605, filed on Dec. 15, 2004, now Pat. No. 7,446,023, and a continuation-in-part of application No. 10/801,377, filed on Mar. 15, 2004, now Pat. No. 7,122,487, and a continuation-in-part of application No. 11/139,726, filed on May 26, 2005, now Pat. No. 7,381,595, and a continuation-in-part of application No. 10/871,939, filed on Jun. 17, 2004, now Pat. No. 7,186,663, and a continuation-in-part of application No. 10/801,374, filed on Mar. 15, 2004, now Pat. No. 7,087,537.

(51) Int. Cl.
*H01L 21/00* (2006.01)
*H01L 21/20* (2006.01)
*H01J 1/62* (2006.01)
*H01J 9/24* (2006.01)

(52) U.S. Cl. .................. 313/503; 445/24; 257/E21.09; 438/29

(58) Field of Classification Search .................. 438/29; 257/E21.09; 313/503; 445/24
See application file for complete search history.

(56) References Cited

U.S. PATENT DOCUMENTS 5,882,779 A * 3/1999 Lawandy .................... 428/323

(Continued)

*Primary Examiner*—Karabi Guharay
*Assistant Examiner*—Sheryl Hull
(74) *Attorney, Agent, or Firm*—Law Office of Gerald Maliszewski; Gerald Maliszewski

(57) ABSTRACT

A silicon (Si) nanocrystal embedded Si oxide electroluminescence (EL) device and associated fabrication process are presented. The method provides a substrate bottom electrode, and forms a plurality of Si nanocrystal embedded SiOx film layers overlying the bottom electrode, where X is less than 2. Each SiOx film layer has a Si excess concentration in a range of about 5 to 30%. The outside film layers sandwich an inner film layer having a lower concentration of Si nanocrystals. Alternately stated, the outside Si nanocrystal embedded SiOx film layers have a higher electrical conductivity than a sandwiched inner film layer. A transparent top electrode is formed over the plurality of Si nanocrystal embedded SiOx film layers. The plurality of Si nanocrystal embedded SiOx film layers are deposited using a high density plasma-enhanced chemical vapor deposition (HD PECVD) process. The HD PECVD process initially deposits SiOx film layers, which are subsequently annealed.

23 Claims, 5 Drawing Sheets

U.S. PATENT DOCUMENTS

| | | | | |
|---|---|---|---|---|
| 6,005,342 A | * | 12/1999 | Morton | 313/486 |
| 6,992,317 B2 | * | 1/2006 | Jain et al. | 257/14 |
| 7,220,609 B2 | * | 5/2007 | Zacharias | 438/29 |
| 2004/0214362 A1 | * | 10/2004 | Hill et al. | 438/33 |
| 2005/0051777 A1 | * | 3/2005 | Hill | 257/72 |

* cited by examiner

Fig. 1 *(PRIOR ART)*
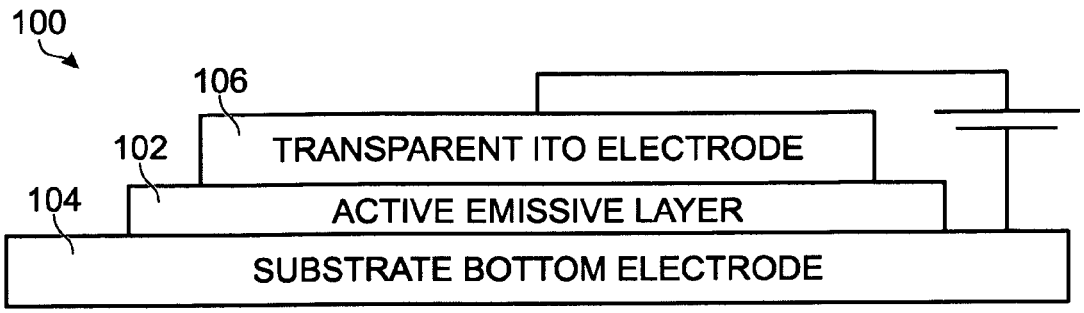
Fig. 2
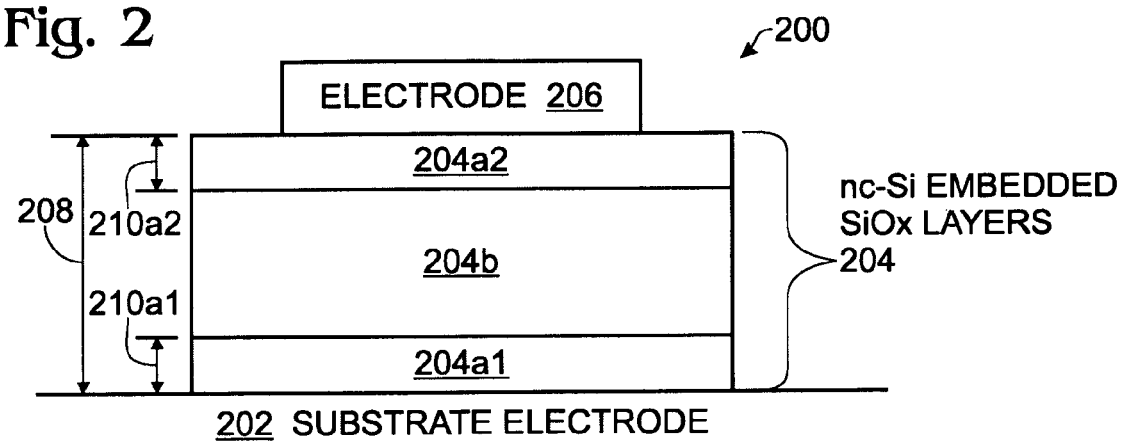
Fig. 3
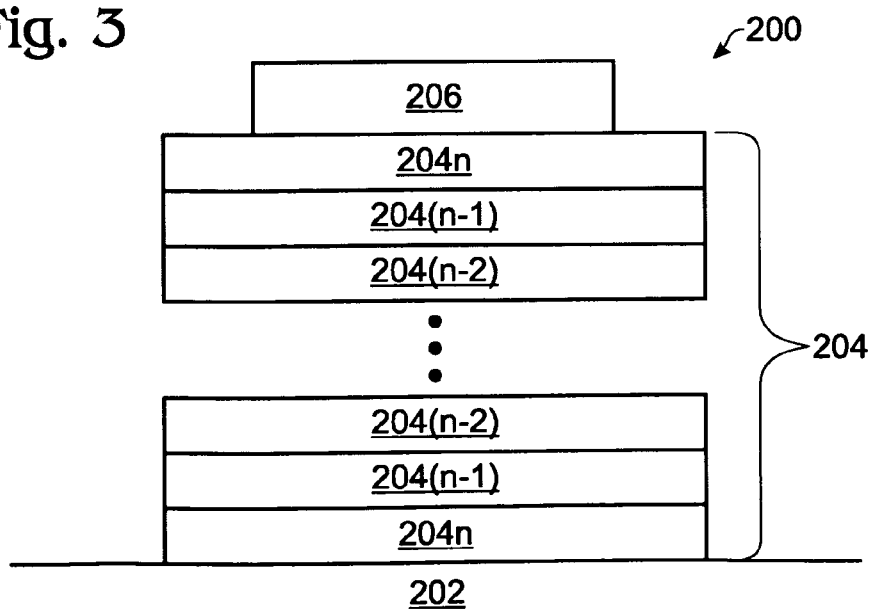

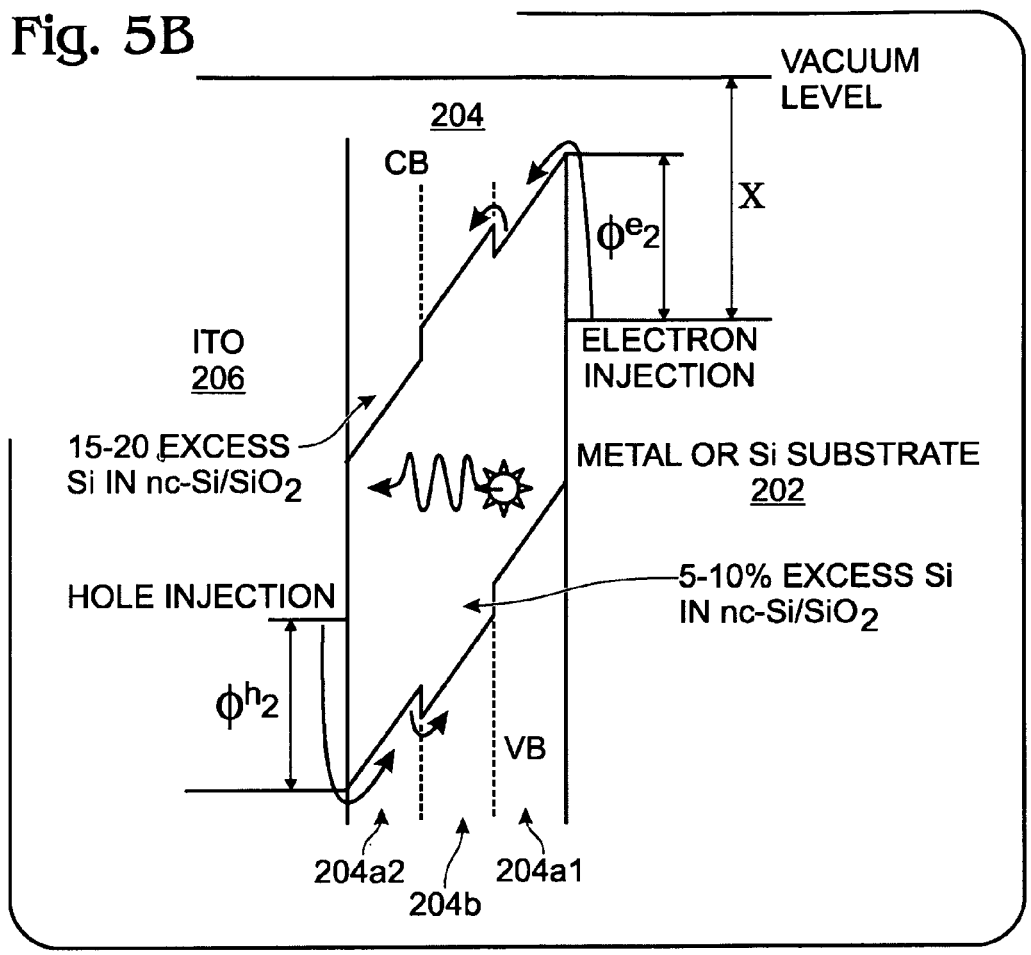

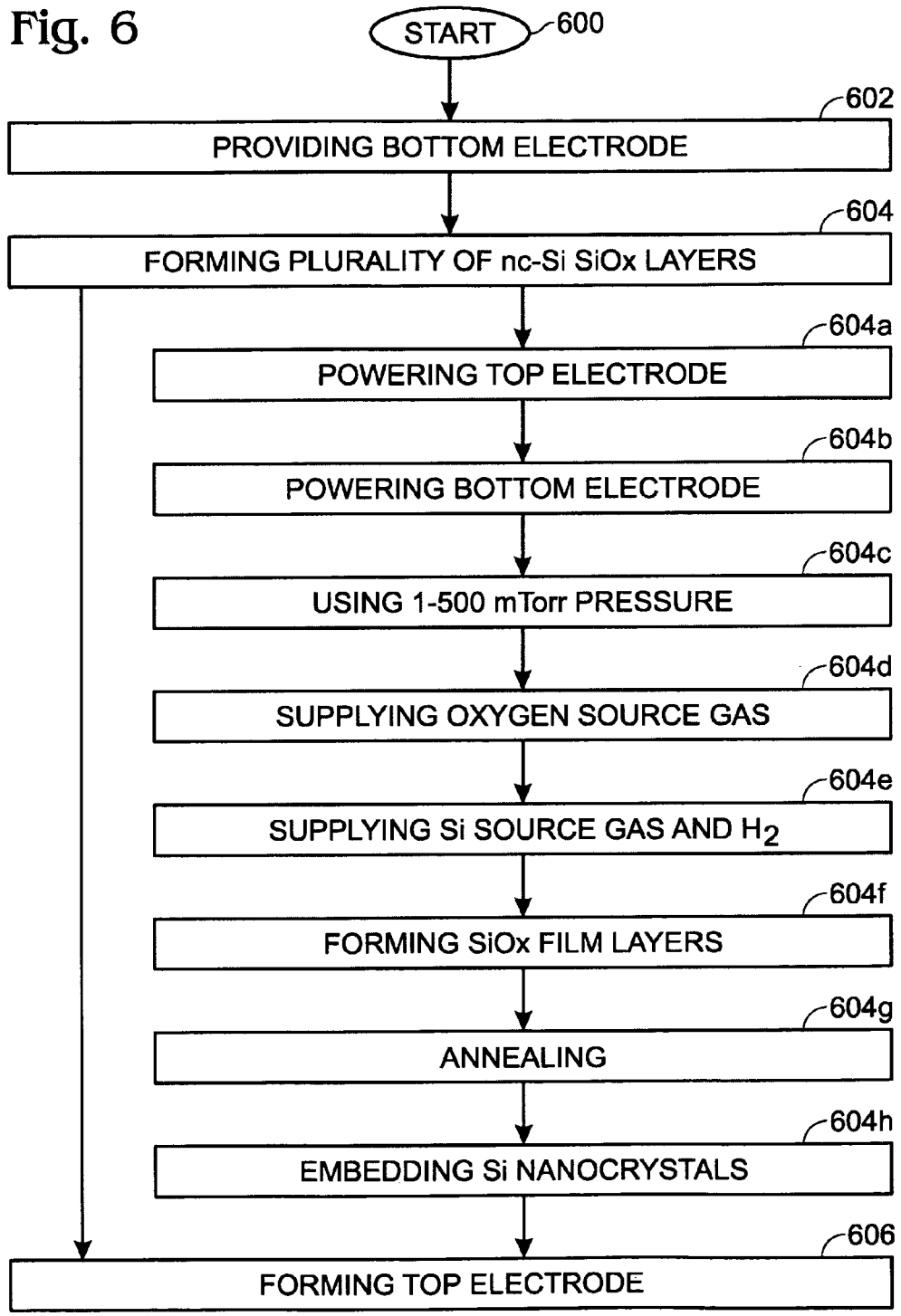

GRADED JUNCTION SILICON NANOCRYSTAL EMBEDDED SILICON OXIDE ELECTROLUMINESCENCE DEVICE

RELATED APPLICATIONS

This application is a continuation-in-part of a pending patent application entitled, LIGHT EMITTING DEVICE WITH A NANOCRYSTALLINE SILICON EMBEDDED INSULATOR FILM, invented by Huang et al., Ser. No. 12/126,430, filed May 23, 2008, which is a Continuation-in-Part of:

a pending patent application entitled, SILICON OXIDE THIN-FILMS WITH EMBEDDED NANOCRYSTALLINE SILICON, invented by Pooran Joshi et al., Ser. No. 11/418,273, filed May 4, 2006 now U.S. Pat. No. 7,544,625, which is a Continuation-in-Part of the following applications:

ENHANCED THIN-FILM OXIDATION PROCESS, invented by Pooran Joshi et al., Ser. No. 11/327,612, filed Jan. 6, 2006;

HIGH-DENSITY PLASMA HYDROGENATION, invented by Pooran Joshi et al., Ser. No. 11/013,605, filed Dec. 15, 2004 now U.S. Pat. No. 7,446,023;

DEPOSITION OXIDE WITH IMPROVED OXYGEN BONDING, invented by Pooran Joshi, Ser. No. 10/801,377, filed Mar. 15, 2004 now U.S. Pat. No. 7,122,487;

HIGH-DENSITY PLASMA OXIDATION FOR ENHANCED GATE OXIDE PERFORMANCE, invented by Joshi et al., Ser. No. 11/139,726, filed May 26, 2005 now U.S. Pat. No. 7,381,595;

HIGH-DENSITY PLASMA PROCESS FOR SILICON THIN-FILMS, invented by Pooran Joshi, Ser. No. 10/871,939, filed Jun. 17, 2004 now U.S. Pat. No. 7,186,663;

METHOD FOR FABRICATING OXIDE THIN-FILMS, invented by Joshi et al., Ser. No. 10/801,374, filed Mar. 15, 2004 now U.S. Pat. No. 7,087,537.

All the above-referenced applications are incorporated herein by reference.

BACKGROUND OF THE INVENTION

1. Field of the Invention

This invention generally relates to integrated circuit (IC) fabrication and, more particularly, to an electroluminescence (EL) device made from a graded layering of silicon (Si) nanocrystal (nc) embedded Si oxide (SiOx) films.

2. Description of the Related Art

FIG. 1 is a schematic block diagram of an electroluminescence device made from a Si rich SiOx emissive layer (prior art). The current state of the art in silicon photonics uses silicon nanocrystals embedded in a silicon dioxide ($SiO_2$) matrix. Such a material is fabricated by several methods. One simple fabrication method is by the ion implantation of Si ions into $SiO_2$ films, and another is by plasma-enhanced chemical vapor deposition (PECVD) of excess Si into oxide films. The EL device 100 has an active emissive layer 102 that is deposited onto a conductive substrate 104, such as a doped Si wafer that serves as a bottom electrode.

This emissive layer 102 is a film in which an excess of Si is deposited in concert with $SiO_2$, and is subsequently annealed. The excess Si aggregates into distinct phases of Si nanocrystals on the order of 5 nanometers (nm) to 10 (nm). These nanophases of Si provide a quantum confinement that permits the radiative decay of excited optical states. After the deposition of the active emissive layer 102, a transparent conductive electrode 106, such as indium tin oxide (ITO), is deposited, which permits the transmission of the device optical output under bias.

With this construction, charge carriers (electrons and holes) are injected from both electrodes 104/106 and form excited optical states in the Si nanocrystals (nc-Si) called excitons. If the nc-Si phases are of the proper size and distribution, the excitons decay into optical emission or electroluminescence. Conventionally, a single emissive layer is formed (as shown), which is exclusively responsible for carrier transport, exciton formation, and subsequent radiative decay. Based on empirical data, it has been determined that the balancing all of these interactions is difficult within a single homogeneous film. A nc-Si in-oxide material that is efficient in transporting charge carriers is not necessarily efficient in allowing excitons to decay into light emission. Emissive films with a higher concentration of nc-Si particles (e.g., greater than 20% excess) are better conductors than light emitters, since the close proximity permits many of the nano-particles in the excited state to simply dissipate into heat or current. On the other hand, a lower nc-Si concentration (e.g., 5-10% excess) does permit exciton radiative decay if inter-particle spacing is sufficient. Generating sufficient current to form excitons on nc-Si particles is facilitated using a high nc-Si in-oxide concentration material, but this same material will not support the radiative decay of excitons with the same efficiency as a lower concentration nc-Si Si oxide material.

It would be advantageous if an EL device could be made from a Si rich Si oxide emissive layer that supports both radiative decay, as well as the generation of excitons.

SUMMARY OF THE INVENTION

An injection EL device is disclosed that provides for enhanced optical emission based upon the control of charge injection characteristics and EL efficiency during the active layer deposition. The actives layers are deposited in a high pressure (HP) plasma enhanced chemical vapor deposition (PECVD) of silicon rich silicon dioxide (SRSO), using silane ($SiH_4$) and nitrous oxide ($N_2O$) in concert with helium (He) and hydrogen ($H_2$). This film is deposited with an excess of silicon, over and above the stoichiometric amount needed to form silicon dioxide ($SiO_2$). The excess may be controlled through the ratio of silane to nitrous oxide, for example.

Accordingly, a method is provided for forming a Si nanocrystal embedded Si oxide EL device. The method provides a substrate bottom electrode, and forms a plurality of Si nanocrystal embedded SiOx film layers overlying the bottom electrode, where X is less than 2. More explicitly, each Si nanocrystal embedded SiOx film layer has a Si excess concentration in a range of about 5 to 30%. The outside film layers sandwich an inner film layer having a lower concentration of Si nanocrystals. Alternately stated, the outside Si nanocrystal embedded SiOx film layers have a higher electrical conductivity than a sandwiched inner film layer. A transparent top electrode is formed over the plurality of Si nanocrystal embedded SiOx film layers.

The plurality of Si nanocrystal embedded SiOx film layers are deposited using a HD PECVD process. The HD PECVD process initially deposits SiOx film layers, which are subsequently annealed, embedding Si nanocrystals in the SiOx film layers. The Si nanocrystals have a diameter in the range of about 2 to 10 nm.

In one aspect, the plurality of Si nanocrystal embedded SiOx film layers has a total thickness in the range of about 50 to 500 nm. If three film layers are formed for example, each outside film layer occupies between 1 and 20% of the total thickness.

Additional details of the above-described method and a Si nanocrystal embedded Si oxide EL device are provided below.

BRIEF DESCRIPTION OF THE DRAWINGS

FIG. 1 is a schematic block diagram of an electroluminescence device made from a Si rich SiOx emissive layer (prior art).

FIG. 2 is a partial cross-sectional view of a Si nanocrystal embedded Si oxide electroluminescence (EL) device.

FIG. 3 is a partial cross-sectional view of a first variation of the Si nanocrystal embedded Si oxide EL device of FIG. 2.

FIGS. 5A and 5B are injection energy barrier diagrams schematically comparing the conventional SRSO EL device of FIG. 1 with the EL device of FIG. 2.

FIG. 6 is a flowchart illustrating a method for forming a Si nanocrystal embedded Si oxide EL device.

DETAILED DESCRIPTION

Figure 4:
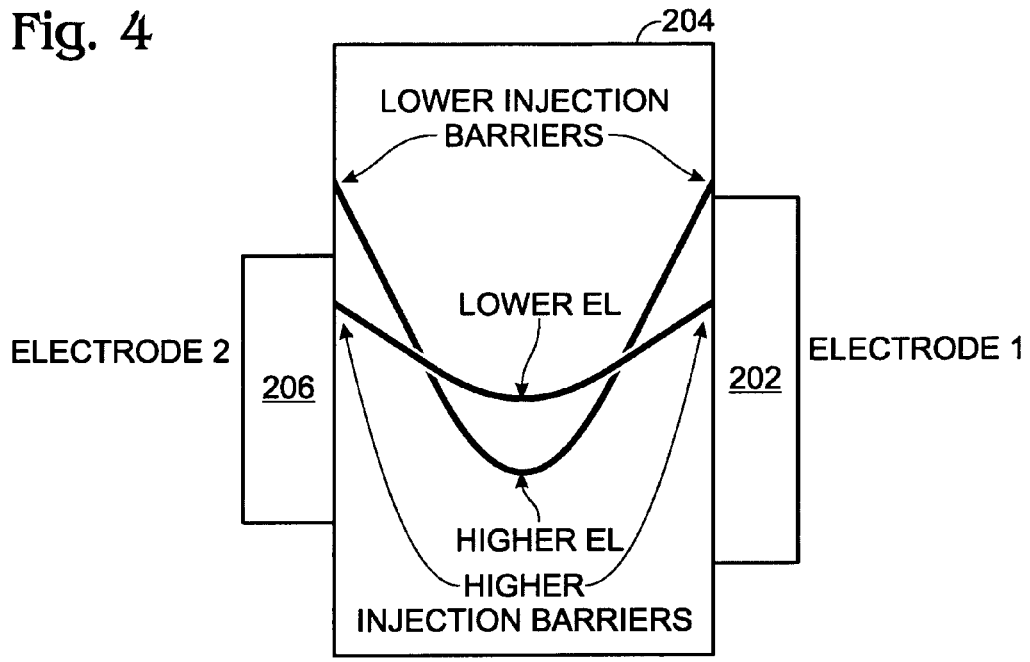
FIG. 4 is a diagram of the EL devices of FIGS. 2 and 3, schematically depicting nanocrystalline Si concentration in the plurality of Si nanocrystal embedded SiOx films.

FIG. 2 is a partial cross-sectional view of a Si nanocrystal embedded Si oxide electroluminescence (EL) device. The EL device 200 comprises a substrate bottom electrode 202. A plurality of Si nanocrystal embedded SiOx film layers 204 overlie the bottom electrode 202, where X is less than 2, and where outside film layers 204a1 and 204a2 sandwich an inner film layer 204b having a lower concentration of Si nanocrystals. The Si nanocrystal embedded SiOx film layers are also referred to herein as nc-Si $SiO_X$ film layers, or nc-Si embedded $SiO_X$ film layers. A transparent top electrode 206 overlies the plurality of Si nanocrystal embedded SiOx film layers. ITO is an example of a transparent electrode. Other examples include thin metal layers.

FIG. 3 is a partial cross-sectional view of a first variation of the Si nanocrystal embedded Si oxide EL device of FIG. 2. More generally, the EL device 200 is not limited to just three Si nanocrystal embedded Si oxide layers. In this aspect, Si nanocrystal embedded Si oxide layers 204n are outside, and therefore sandwich, inside layers 204(n−1). Outside layers 204n have a higher concentration of Si nanocrystals than inside layers 204(n−1). Likewise, layers 204(n−1) are outside, and therefore sandwich, inside layers 204(n−2). In this manner, the excess Si content in the Si nanocrystal embedded Si oxide layers can be graded.

Referencing either FIG. 2 or FIG. 3, each Si nanocrystal embedded SiOx film layer has a Si richness defined as $Si_JO_2$, wherein J varies from about 1.05 to 1.3, and where outer film layers sandwich an inner film layer having a lower Si richness. That is, each Si nanocrystal embedded SiOx film layer has a Si excess concentration in a range of about 5 to 30%. Alternately expressed, the outside Si nanocrystal embedded SiOx film layers have a higher electrical conductivity than a sandwiched inner film layer. The Si nanocrystals in the Si nanocrystal embedded SiOx films have a diameter in a range of about 2 to 10 nm.

In addition to density changes from layer to layer, the Si nanoparticle size may change from layer to layer. In some aspects, the changes in nanoparticle size are responsive to Si nanocrystal density. Therefore, the differences between Si nanocrystal embedded SiOx film layers may be understood as a difference of silicon "richness", as richness effects both the size and density of Si nanocrystals.

The plurality of Si nanocrystal embedded SiOx film layers 204 have a total thickness 208 in the range of about 50 to 500 nanometers (nm). Referencing FIG. 2 in particular, the plurality of Si nanocrystal embedded SiOx film layers 204 form three film layers. Outside film layers 204a1 and 204a2, have thicknesses 210a1 and 210a2, respectively, that each occupy between 1 and 20% of the total thickness 208. Note: neither Si content not the thicknesses of the Si nanocrystal embedded SiOx film layers need necessarily be symmetrical. For example, the top film layer 204a2 may be thicker than the bottom film layer 204a1, or may have a different Si content. It should also be understood that there need not be an odd number of nc-Si Si oxide layers between electrodes 202 and 206.

Functional Description

The injection EL devices depicted in FIGS. 2 and 3 have an enhanced optical emission capability, due to the control of charge injection characteristics and EL efficiency created during the active layer deposition process. These Si nanocrystal embedded $SiO_X$ active layers are deposited using high pressure (HP) plasma enhanced chemical vapor deposition (PECVD) of silicon rich silicon dioxide (SRSO). In one aspect, silane ($SiH_4$) and nitrous oxide ($N_2O$) are used in concert with helium (He) and hydrogen ($H_2$). The films are deposited with an excess of silicon, over and above the stoichiometric amount needed to form silicon dioxide. Continuing the example above, the excess Si can be controlled with the ratio of silane to nitrous oxide.

Observations have also been made that the carrier injection barrier from the Si substrate electrodes and the indium tin oxide (ITO) is made more facile by the use of a Si rich Si oxide (SRSO) having an excess Si concentration of 5-30%, and preferably 10-20%. This result is reasonable when considering that the energy barriers for injection into such an EL emissive layer may be considered to be a composite value of the oxide barriers and nc-Si barriers against their respective electrodes. As opposed to injection into pure oxide, the composite SRSO material has a lower energy barrier due to the nc-Si inclusions. Data taken thus far supports the conclusion that that reduction in barrier height does scale with nc-Si concentration, but the exact functionality has not been established.

Although the injection energy into a higher concentration nc-Si EL material is lower, a higher excess concentration of nc-Si (in the range of 15-20%) offers a less efficient EL material than materials in the range of 5-10%. This result is due to the fact that non-radiative pathways exist for the higher concentration nc-Si material. This fact can be rationalized in considering that a higher nc-Si density makes the bulk behave more "silicon-like". Viewing this result from the perspective of quantum confinement, when the exciton diffusion length is larger than the nc-Si particle size, it is imperative that potentially radiative excitons of a particular particle do not overlap substantially with their nearest neighbors such that they decay in a non-radiative fashion. Therefore, particle separation is a key element to emission efficiency that higher nc-Si concentrations do not afford, and thus the quantum confinement of radiative excitons is better affected in a sparse nc-Si distribution.

FIG. 4 is a diagram of the EL devices of FIGS. 2 and 3, schematically depicting nanocrystalline Si concentration in the plurality of Si nanocrystal embedded SiOx films. In order to realize a reduction in barrier, while enhancing EL efficiency, a novel emissive layer construction has been developed that permits control over the two factors of emissions efficiency and injection energy. In theory, the interior of the EL film has a lower nc-Si concentration than the exterior surfaces of the film.

Another problem with the fabrication of Si nanocrystal embedded SiOx films is that once a particle density and size maximum is reached upon annealing, further annealing tends to oxide these particles due to residual oxide in the film and the local heat treatment environment. Thus, a capping layer of excess Si on both of the contact sides has an ameliorating tendency, since a higher concentration of nc-Si compensates for the oxidation. Increased nc-Si concentration on either side of the emissive film has the beneficial qualities of a capping layer and injection barrier control.

One way of approximating the profile of FIG. 4 is by depositing three separate compositions onto the electrode substrate, as shown in FIG. 2. The first layer (bottom film 204$a$1) has a relatively high nc-Si content, 15-20% excess for example, and has a thickness 210$a$1 on the order of 10 nm in thickness. Layer 204$a$1 serves as the injection medium for the bottom electrode 202. The second layer 204$b$ has a lower nc-Si content, on the order of 5-10% excess for example, and serves as the exciton emission layer where the proper quantum confinement is maintained. This emissive layer may have a thickness of ~15-20 nm, for example. The third layer 204$a$2 is the injection medium for the top electrode 206 and it has a relatively high concentration of nc-Si (15-20% excess for example) material, with a thickness of 10 nm.

During annealing, there is layer diffusion of nc-Si from the high concentration layers to the low concentration layers, which serves to create a gradual injection energy slope for carriers to transition from non-recombinative transport (capping layers) to radiative exciton formation in the center region. In this way, a gradual barrier is formed in contrast to a sharp, Schottky-type barrier. This device design permits much latitude in tailoring the turn-on voltage and emission efficiency.

Figure 5A:
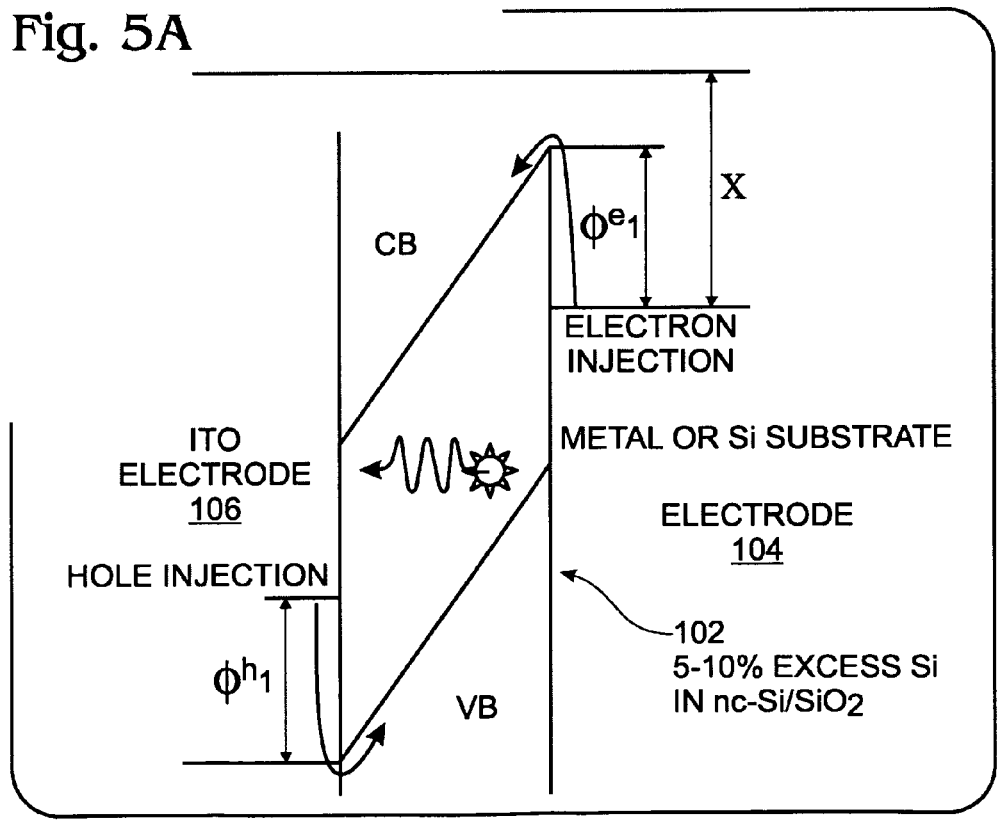

FIGS. 5A and 5B are injection energy barrier diagrams schematically comparing the conventional SRSO EL device of FIG. 1 with the EL device of FIG. 2. In a bias situation where the ITO serves as the hole injector, the energy barrier construction for the composite Si nanocrystal embedded SiOx film layers is shown in FIG. 5B, in contrast to the simple one layer emissive device (FIG. 5A) under the sample bias condition. The carriers are injected in a cascade fashion between the valence band (VB) and the conductance band (CB). Another advantage of the composite layer approach is that each injection layer thickness can be adjusted to compensate for differences in electron and holes. For example, assuming that the electron mobility is greater than the hole mobility in the high nc-Si injection material, the layer responsible for electron injection can be increased in thickness to ensure balanced injection into the lower nc-Si concentration emissive layer.

FIG. 6 is a flowchart illustrating a method for forming a Si nanocrystal embedded Si oxide EL device. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 600.

Step 602 provides a substrate bottom electrode. Step 604 forms a plurality of Si nanocrystal embedded SiOx film layers overlying the bottom electrode, where X is less than 2, and where outside film layers sandwich an inner film layer having a lower concentration of Si nanocrystals. Typically, the Si nanocrystals have a diameter in the range of about 2 to 10 nm. Step 606 forms a transparent top electrode overlying the plurality of Si nanocrystal embedded SiOx film layers.

In one aspect, forming the plurality of Si nanocrystal embedded SiOx film layers in Step 604 includes forming each film layer having a Si excess concentration in a range of about 5 to 30%. Alternately expressed, each Si nanocrystal embedded SiOx film layer has a Si richness defined as $Si_JO_2$, wherein J varies from about 1.05 to 1.3, and where outer film layers sandwich an inner film layer having a lower Si richness. In another aspect, forming the plurality of Si nanocrystal embedded SiOx film layers in Step 604 includes forming outside Si nanocrystal embedded SiOx film layers having a higher electrical conductivity than a sandwiched inner film layer.

In another aspect, forming the plurality of Si nanocrystal embedded SiOx film layers in Step 604 includes depositing the film layers using a high density plasma-enhanced chemical vapor deposition (HD PECVD) process. The HD PECVD process can be distinguished from other plasma-enhanced deposition methods in the use of a plasma concentration of greater than $1 \times 10^{11}$ $cm^{-3}$, with an electron temperature of less than 10 eV.

The HD PECVD process of Step 604 includes the following substeps. Step 604$a$ supplies power to a top electrode at a frequency in the range of 13.56 to 300 megahertz (MHz), and a power density of less than 10 watts per square centimeter ($W/cm^2$). Step 604$b$ supplies power to a bottom electrode at a frequency in the range of 50 kilohertz to 13.56 MHz, and a power density of up to 3 $W/cm^2$. Step 604$c$ uses an atmosphere pressure in the range of 1 to 500 mTorr. Step 604$d$ supplies an oxygen source gas. Step 604$e$ supplies a Si source gas, with $H_2$. In response to the above-mentioned process substeps, Step 604$f$ forms a SiOx film layers. Subsequent to forming the SiOx film layers in Step 604$f$, Step 604$g$ anneals. In response to the annealing, Step 604$h$ embeds Si nanocrystals in the SiOx film layers.

In one aspect, supplying the oxygen source gas in Step 604$d$ includes supplying an oxygen source gas such as $N_2O$, NO, $O_2$, or $O_3$. In another aspect, supplying the Si source gas in Step 604$e$ includes supplying either $Si_NH_{2N+2}$, where N varies from 1 to 4, or $SiH_XR_{4-X}$, where X varies from 0 to 3, and where R may be Cl, Br, or I.

The electrical conductivity of each film layer formed in Step 604 in responsive to varying the ratio of Si source gas to oxygen source gas in the range between 0.1 and 10. Alternately, the electrical conductivity of each film layer formed in Step 604 is responsive to varying the ratio of Si source gas to hydrogen in the range between 0.1 and 100.

In one aspect, forming the plurality of Si nanocrystal embedded SiOx film layers in Step 604 includes forming the plurality of film layers with a total thickness in a range of about 50 to 500 nanometers (nm). If Step 604 forms three Si nanocrystal embedded SiOx film layers, then each outside film layer occupies between 1 and 20% of the total thickness.

In another aspect, forming the plurality of Si nanocrystal embedded SiOx film layers in Step 604 includes forming a graduated carrier injection energy slope between Si nanocrystal embedded SiOx films. The barrier has a "slope" that is the relative change in the barrier height (see FIG. 5B), which can be tailored by the change in the nanoparticle size and density from one layer to the next. Changes in nanoparticle size and density are controlled by adjustments in deposition parameters, such as gas flow ratio of $SiH_4$ to $N_2O$, pressure, temperature, etc.

Figure 7:
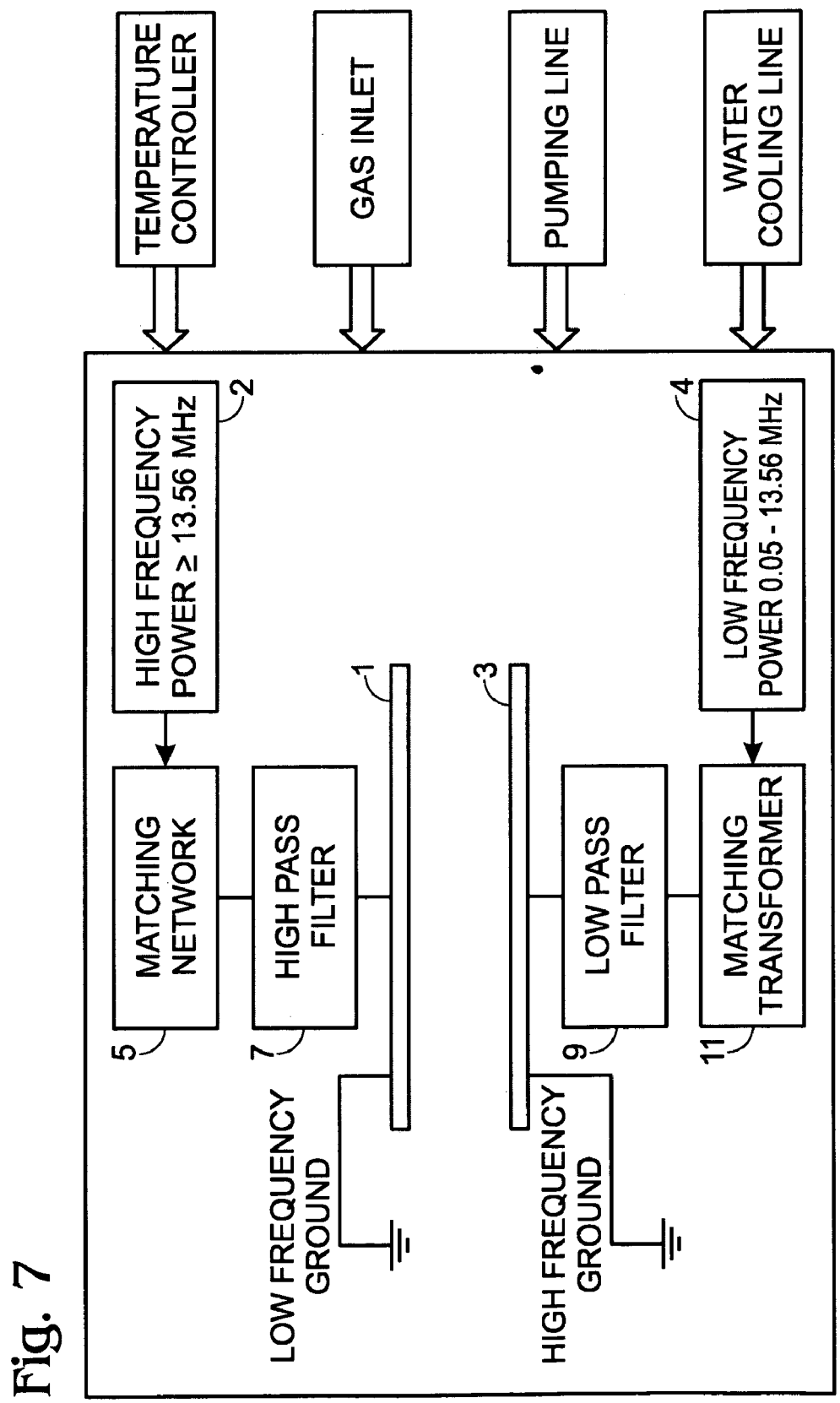
FIG. 7 is a schematic drawing of a high-density plasma (HDP) system with an inductively coupled plasma source.

FIG. 7 is a schematic drawing of a high-density plasma (HDP) system with an inductively coupled plasma source. The system depicted in FIG. 7 is one example of a system that can be used to enable the above-described HD PECVD process for the deposition of Si-nc embedded SiOx. The top electrode 1 is driven by a high frequency radio frequency (RF) source 2, while the bottom electrode 3 is driven by a lower frequency power source 4. The RF power is coupled to the top electrode 1, from the high-density inductively coupled plasma (ICP) source 2, through a matching network 5 and high pass filter 7. The power to the bottom electrode 3, through a low pass filter 9 and matching transformer 11, can be varied independently of the top electrode 1. The top electrode power frequency can be in the range of about 13.56 to about 300 megahertz (MHz) depending on the ICP design. The bottom electrode power frequency can be varied in the range of about 50 kilohertz (KHz) to about 13.56 MHz, to control the ion energy. The pressure can be varied up to 500 mTorr. The top electrode power can be as great as about 10 watts per square-centimeter ($W/cm^2$), while the bottom electrode power can be as great as about 3 $W/cm^2$.

One interesting feature of the HDP system is that there are no inductive coils exposed to the plasma, which eliminates any source-induced impurities. The power to the top and bottom electrodes can be controlled independently. There is no need to adjust the system body potential using a variable capacitor, as the electrodes are not exposed to the plasma. That is, there is no crosstalk between the top and bottom electrode powers, and the plasma potential is low, typically less than 20 V. System body potential is a floating type of potential, dependent on the system design and the nature of the power coupling.

The HDP tool is a true high density plasma process with an electron concentration of greater than $1 \times 10^{11}$ $cm^{-3}$, and the electron temperature is less than 10 eV. There is no need to maintain a bias differential between the capacitor connected to the top electrode and the system body, as in many high density plasma systems and conventional designs such as capacitively-coupled plasma tools. Alternately stated, both the top and bottom electrodes receive RF and low frequency (LF) powers.

Generally, the present invention high density plasma process is efficient in the creation of active hydrogen species for the generation and control of the nc-Si particle (size and density). The plasma-generated hydrogen species are also influential for inducing crystallinity in the generated nc-Si particles. Hydrogen plasma can minimize the amorphous phase by efficient etching of the generated Si nano-particles. Additionally, hydrogen bombardment can efficiently break silane in the plasma for the generation and control of the nano-particles. The addition of hydrogen has been effective in lowering the grain growth temperature in microcrystalline silicon films. The HDP-generated hydrogen species can further enhance the optical performance of nc-Si embedded SiOx thin films by in-situ passivation of the defective bonds. The defective bonds often lead to a decreased PL/EL response due to absorption and non-radiative recombination processes. The hydrogen plasma addition is specifically effective for the creation of nc-Si particles emitting PL signal at wavelengths exceeding 600 nm. The increased particle density and sizes by active hydrogen species in the high density plasma lead to enhanced PL performance at wavelengths in the range of 400-900 nm.

TABLE III

| High density plasma using $H_2$ | |
|---|---|
| Top Electrode Power | 13.56-300 MHz, up to 10 $W/cm^2$, |
| Bottom Electrode Power | 50 KHz-13.56 MHz, up to 3 $W/cm^2$ |
| Pressure | 1-500 mTorr |
| Gases: general | Any suitable precursor for Si + Source of Oxygen: $O_2$, $N_2O$ + Noble Gas (He, Ar, Kr, etc.) |
| Exemplary Gases | $SiH_4$ + $N_2O$ + $H_2$ |
| Temperature | 25-400° C. |
| Film Thickness (nm) | 5 nm-1 μm |

A Si nanocrystal embedded Si oxide EL device and associated fabrication process have been presented. Specific device dimensions, structures, and process details have been provided as examples to illustrate the invention. However, the invention is not necessarily limited to just these examples. Other variations and embodiments of the invention will occur to those skilled in the art.

We claim:

1. A method for forming a silicon (Si) nanocrystal embedded Si oxide electroluminescence (EL) device, the method comprising:
   providing a substrate bottom electrode;
   forming a plurality of Si nanocrystal embedded SiOx film layers overlying the bottom electrode, where X is less than 2, and where outside film layers sandwich an inner film layer having a lower concentration of Si nanocrystals; and,
   forming a transparent top electrode overlying the plurality of Si nanocrystal embedded SiOx film layers.

2. The method of claim 1 wherein forming the plurality of Si nanocrystal embedded SiOx film layers includes forming outside Si nanocrystal embedded SiOx film layers having a higher electrical conductivity than a sandwiched inner film layer.

3. The method of claim 1 wherein forming the plurality of Si nanocrystal embedded SiOx film layers includes depositing the film layers using a high density plasma-enhanced chemical vapor deposition (HD PECVD) process.

4. The method of claim 3 wherein depositing the plurality of Si nanocrystal embedded SiOx film layers using the HD PECVD process includes:
   supplying power to a top electrode at a frequency in the range of 13.56 to 300 megahertz (MHz), and a power density of less than 10 watts per square centimeter ($W/cm^2$);
   supplying power to a bottom electrode at a frequency in the range of 50 kilohertz to 13.56 MHz, and a power density of up to 3 $W/cm^2$;
   using an atmosphere pressure in the range of 1 to 500 mTorr;
   supplying an oxygen source gas;
   supplying a Si source gas, with $H_2$; and,
   in response, forming a SiOx film layers.

5. The method of claim 4 wherein depositing the plurality of Si nanocrystal embedded SiOx film layers using the HD PECVD process includes:
   subsequent to forming the SiOx film layers, annealing; and,
   in response, embedding Si nanocrystals in the SiOx film layers.

6. The method of claim 4 wherein supplying the oxygen source gas includes supplying an oxygen source gas from a source selected from a group consisting of $N_2O$, NO, $O_2$, and $O_3$.

7. The method of claim 4 wherein supplying the Si source gas includes supplying a gas selected from a group consisting of $Si_NH_{2N+2}$, where N varies from 1 to 4, and $SiH_XR_{4-X}$, where X varies from 0 to 3, and R is selected from a group consisting of Cl, Br, and I.

8. The method of claim 4 wherein forming the Si nanocrystal embedded SiOx film layers includes selecting the electrical conductivity of each film layer in response to varying the ratio of Si source gas to oxygen source gas in a range between 0.1 and 10.

9. The method of claim 4 wherein forming the Si nanocrystal embedded SiOx film layers includes selecting the electrical conductivity of each film layer in response to varying the ratio of Si source gas to hydrogen in a range between 0.1 and 100.

10. The method of claim 3 wherein depositing the plurality of Si nanocrystal embedded SiOx film layers using the HD PECVD process includes using a plasma concentration of greater than $1 \times 10^{11}$ cm$^{-3}$, with an electron temperature of less than 10 eV.

11. The method of claim 1 wherein forming the plurality of Si nanocrystal embedded SiOx film layers includes forming each film layer having a Si excess concentration in a range of about 5 to 30%.

12. The method of claim 1 wherein forming the plurality of Si nanocrystal embedded SiOx film layers includes each film layer with a Si richness defined as $Si_JO_2$, wherein J varies from about 1.05 to 1.3, and where outer film layers sandwich an inner film layer having a lower Si richness.

13. The method of claim 1 wherein forming the plurality of Si nanocrystal embedded SiOx film layers includes forming the plurality of film layers with a total thickness in a range of about 50 to 500 nanometers (nm).

14. The method of claim 13 wherein forming the plurality of Si nanocrystal embedded SiOx film layers includes forming three film layers, where each outside film layer occupies between 1 and 20% of the total thickness.

15. The method 1 of claim 1 wherein forming the plurality of Si nanocrystal embedded SiOx film layers includes forming each film layer with Si nanocrystals having a diameter in a range of about 2 to 10 nm.

16. The method of claim 1 wherein forming the plurality of Si nanocrystal embedded SiOx film layers includes forming a graduated carrier injection energy slope between Si nanocrystal embedded SiOx films.

17. A silicon (Si) nanocrystal embedded Si oxide electroluminescence (EL) device, the EL device comprising:
a substrate bottom electrode;
a plurality of Si nanocrystal embedded SiOx film layers overlying the bottom electrode, where X is less than 2, and where outside film layers sandwich an inner film layer having a lower concentration of Si nanocrystals; and,
a transparent top electrode overlying the plurality of Si nanocrystal embedded SiOx film layers.

18. The EL device of claim 17 wherein outside Si nanocrystal embedded SiOx film layers have a higher electrical conductivity than a sandwiched inner film layer.

19. The EL device of claim 17 wherein each Si nanocrystal embedded SiOx film layer has a Si excess concentration in a range of about 5 to 30%.

20. The EL device of claim 17 wherein each Si nanocrystal embedded SiOx film layer has a Si richness defined as $Si_JO_2$, wherein J varies from about 1.05 to 1.3, and where outer film layers sandwich an inner film layer having a lower Si richness.

21. The EL device of claim 17 wherein the plurality of Si nanocrystal embedded SiOx film layers have a total thickness in a range of about 50 to 500 nanometers (nm).

22. The EL device of claim 21 wherein the plurality of Si nanocrystal embedded SiOx film layers form three film layers, where each outside film layer occupies between 1 and 20% of the total thickness.

23. The EL device of claim 17 wherein the plurality of Si nanocrystal embedded SiOx film layers each include Si nanocrystals having a diameter in a range of about 2 to 10 nm.

* * * * *